(12) United States Patent
Åstrand (10) Patent No.: US 9,374,636 B2
(45) Date of Patent: Jun. 21, 2016

(54) HEARING DEVICE, METHOD AND SYSTEM FOR AUTOMATICALLY ENABLING MONITORING MODE WITHIN SAID HEARING DEVICE

(71) Applicant: Sony Corporation, Tokyo (JP)

(72) Inventor: Per Åstrand, Lund (SE)

(73) Assignees: Sony Corporation, Tokyo (JP); Sony Mobile Communication Inc., Tokyo (JP)

( * ) Notice: Subject to any disclaimer, the term of this patent is extended or adjusted under 35 U.S.C. 154(b) by 28 days.

(21) Appl. No.: 14/314,352

(22) Filed: Jun. 25, 2014

(65) Prior Publication Data

US 2015/0382097 A1 Dec. 31, 2015

(51) Int. Cl.
*H04R 1/10* (2006.01)
*H04R 25/00* (2006.01)
*H03G 3/32* (2006.01)
*H03G 3/34* (2006.01)
*H04R 5/04* (2006.01)

(52) U.S. Cl.
CPC ............ *H04R 1/1091* (2013.01); *H04R 1/1083* (2013.01); *H04R 25/43* (2013.01); *H03G 3/32* (2013.01); *H03G 3/342* (2013.01); *H04R 1/1041* (2013.01); *H04R 5/04* (2013.01); *H04R 2225/41* (2013.01); *H04R 2225/61* (2013.01); *H04R 2410/05* (2013.01); *H04R 2430/01* (2013.01)

(58) Field of Classification Search
CPC .................................................... H04R 1/1091
See application file for complete search history.

(56) References Cited

U.S. PATENT DOCUMENTS

| | | | | |
|---|---|---|---|---|
| 8,068,025 B2 * | 11/2011 | Devenyi | ............... | H04R 1/1041 324/76.31 |
| 8,194,865 B2 * | 6/2012 | Goldstein | ............ | H04R 1/1091 381/56 |
| 8,868,137 B2 * | 10/2014 | Hicks, III | ........... | G10K 11/1788 368/11 |
| 9,041,545 B2 * | 5/2015 | Zelepugas | ............ | H04R 1/1041 340/573.1 |
| 2004/0179694 A1 * | 9/2004 | Alley | ..................... | H03G 3/342 381/55 |

(Continued)

FOREIGN PATENT DOCUMENTS

| | | |
|---|---|---|
| EP | 2299591 | 3/2011 |
| EP | 2661097 | 11/2013 |
| WO | WO 2011/001433 | 1/2011 |

OTHER PUBLICATIONS

International Search Report and Written Opinion dated Apr. 1, 2015 for corresponding International Application No. PCT/IB2014/066783.

*Primary Examiner* — Paul Huber
(74) *Attorney, Agent, or Firm* — Tucker Ellis LLP; M. David Galin (57) ABSTRACT

Aspects of the invention relate to a hearing device for automatically enabling monitoring within the hearing device including an electronic module arranged for collecting environment data of the hearing device, wherein environment data is based on events in the vicinity of the hearing device, at least one sound reproducing unit arranged for receiving a first audio signal, wherein the electronic module includes a processor arranged to mix the received first audio signal and a monitored ambient sound signal based on the collected environment data. Aspects of the invention also related to a system and a method for automatically enabling monitoring within the hearing device.

18 Claims, 4 Drawing Sheets

(56) References Cited

U.S. PATENT DOCUMENTS

| | | | | |
|---|---|---|---|---|
| 2008/0240458 A1* | 10/2008 | Goldstein | ............ | H04R 25/453 381/72 |
| 2013/0250080 A1* | 9/2013 | Farrell | ............ | G08B 21/0216 348/77 |
| 2013/0329904 A1 | 12/2013 | Meritt et al. | | |
| 2014/0072154 A1* | 3/2014 | Tachibana | ............ | H04R 5/033 381/309 |
| 2014/0185828 A1* | 7/2014 | Helbling | ............ | H03G 5/165 381/103 |
| 2015/0222977 A1* | 8/2015 | Angel, Jr. | ............ | H04R 1/105 381/74 |

\* cited by examiner

HEARING DEVICE, METHOD AND SYSTEM FOR AUTOMATICALLY ENABLING MONITORING MODE WITHIN SAID HEARING DEVICE

TECHNICAL FIELD

The present invention relates to a hearing device for automatically enabling monitoring of surrounding sounds when necessary. The invention also relates to a system comprising said hearing device, an electronic module and a communication device as well as a method for automatically enabling monitoring mode within said hearing device connected to the communication device.

BACKGROUND ART

Hearing devices, such as earphones and headsets, are today in widespread use for various purposes such as music listening, telephony, hearing protection and hearing enhancement. Today it is also common to wear hearing devices for listening to music while on the move, for example when out running, commuting with bicycle, walking the dog, etc. There are several inconveniences associated with the use of a hearing device, especially when used in environment with varying background noise.

A known solution to this problem is to use hearing devices with adaptive gain control for audio reproduction, compression, masking and noise reduction to reduce or block out background sounds or noise. A disadvantage of these solutions when used in hearing devices is that while wearing such a hearing device, the surrounding sounds are blocked out and in some situations this is unwanted. It can even be dangerous; it could for example prevent a user from hearing a car coming from behind.

Hence, the security level on the hearing devices of today does not fulfill all requirements.

SUMMARY OF THE INVENTION

With the above description in mind, then, an aspect of some embodiments of the present invention is to provide an inventive product for automatically enabling monitoring mode of surrounding sounds when necessary from a security level point of view, which seeks to mitigate, alleviate or eliminate one or more of the above-identified deficiencies in the art and disadvantages singly or in any combination.

An aspect of the present invention relates to a hearing device comprising an electronic module arranged for collecting environment data of said hearing device, wherein environment data is based on events nearby said hearing device, at least one sound reproducing unit arranged for receiving a first audio signal and wherein said electronic module comprising a processor arranged to mix said receive first audio signal and a monitored ambient sound signal based on the collected environment data.

An advantage of the claimed invention is thus that the ambient sound is automatically monitored and mixed with the audio signal when the hearing device enters a safety zone, thus the collected environment data is a predetermined safety zone.

Further advantages are achieved by implementing one or several of the features of the dependent claims.

According to one aspect, the processor is arranged to automatically adapting the volume of the received first audio signal in relation to the volume of the monitored ambient sound signal based on the environment data of the hearing device. An advantage of this is that the level of surrounding sound can be adjusted and controlled by the hearing device.

According to one aspect, the electronic module further comprises a detector unit configured for detecting the environment data.

According to one aspect, the environment data comprises GPS coordinates of the hearing device.

According to one aspect, the environment data comprises a notification of entrance into a predefined zone.

According to one aspect, the environment data comprises a notification of exit out of a predefined zone.

According to one aspect, the hearing device further comprises a microphone arranged for monitoring the ambient sound signal.

An aspect of the present invention relates to a system for automatically enabling a monitoring mode comprising a hearing device and an electronic device, wherein the system comprising an electronic module arranged for collecting environment data of said hearing device, wherein environment data is based on events nearby said hearing device, at least one sound reproducing unit positioned in the hearing device and arranged for receiving a first audio signal and a processor positioned on the electronic module arranged for mixing the received first audio signal and a monitored ambient sound signal based on the detected environment data.

According to one aspect, the electronic module is positioned in the hearing device.

According to one aspect, the electronic module is positioned in the electronic device.

According to one aspect, the hearing device and the electronic device is communicating wirelessly.

According to one aspect, the hearing device and the electronic device is communicating by using Bluetooth.

Another aspect of the present invention relates to a method for automatically enabling monitoring mode using a system as mentioned above, wherein the method comprises the steps of:

detecting environment data of said hearing device, wherein environment data is based on events nearby said hearing device;

sending a first audio signal to said hearing device; and producing a second audio signal in a sound reproducing unit of said hearing device by mixing the received first audio signal and a monitored ambient sound signal based on detected environment data of the hearing device.

An advantage of this method is that the user can hear the surrounding sounds at the same time as the user is listening to music only when entering a safety zone.

According to one aspect, the step of producing comprises instructing a microphone of the hearing device to monitor ambient sound signal based on the detected environment data.

According to one aspect, the step of producing comprises automatically adapting the volume of the received first audio signal in relation to the volume of the monitored ambient sound signal based on the environment data of the hearing device.

The features of the above-mentioned embodiments can be combined in any combinations.

BRIEF DESCRIPTION OF THE DRAWINGS

Further aspects, features and advantages of the present invention will appear from the following detailed description of the invention, wherein embodiments of the invention will be described in more detail with reference to the accompanying drawings, in which.

DETAILED DESCRIPTION

Aspects of the present invention will be described more fully hereinafter with reference to the accompanying drawings. The devices and methods disclosed herein can, however, be realized in many different forms and should not be construed as limited to aspects set forth herein. Like reference signs refer to like elements throughout the text.

The terminology used herein is for the purpose of describing particular aspects of the disclosure only, and is not intended to limit the disclosure. As used herein, the singular forms "a", "an" and "the" are intended to include the plural forms as well, unless the context clearly indicates otherwise.

As used herein, the term "electronic device" includes portable communication device and portable radio communication equipment. Portable communication devices and mobile communication devices may be used synonymously. The term "electronic device" may be referred to below as a mobile phone (or as a mobile telephone, portable phone or portable telephone), a portable device, a portable radio terminal or a portable terminal, includes all electronic equipment, including, but not limited to, capable of being used for voice and/or data communication.

As will be appreciated, the invention may be used with mobile phones, other phones, smartphones, personal digital assistants (PDAs), computers, other communication devices, etc., for brevity, the invention will be described by way of examples with respect to mobile phones, but it will be appreciated that the invention may be used with other communication devices.

Figure 1:
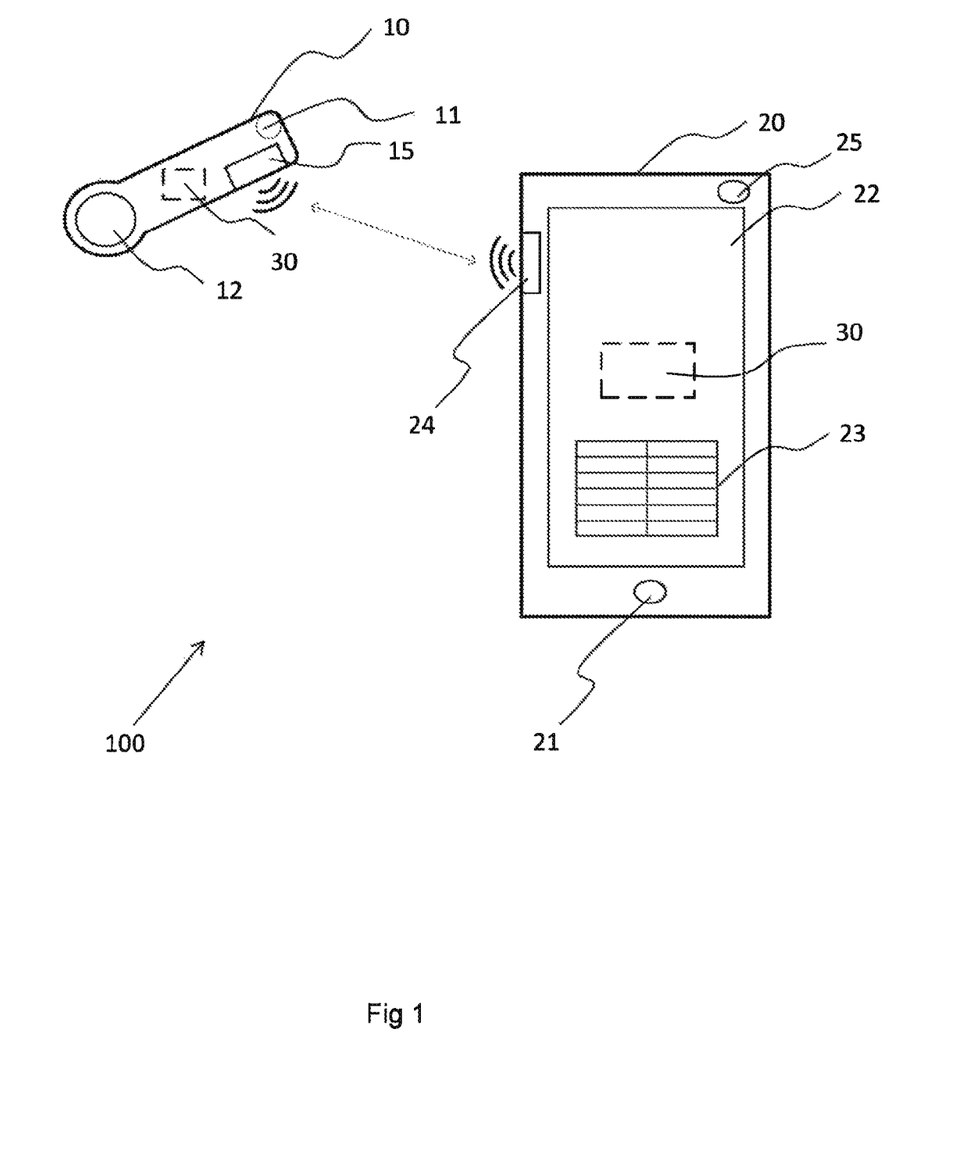
FIG. 1 illustrates a system of an embodiment of the present invention.

Referring in detail to the drawings and initially to FIGS. 1, 2 and 3*a-b*, an electronic device in accordance with an embodiment of the present invention is illustrated generally at 20. The electronic device 20 will be referred to below as a mobile phone. However, as was mentioned above, references to "mobile phones" include various other devices, such as, for example those mentioned above. In outward appearance, for example, as illustrated in FIG. 1, the mobile phone is of one type of design or style; however, the features of the invention, as are described in further detail below may be used in other types of mobile phones. The disclosure relates to the process of enhancing the safety for users of hearing devices, such as headset, earplugs among others, which communicates with a mobile phone. The present disclosure relates to automatically enabling monitoring mode of surrounding sounds when necessary from a security level point of view. The process could be eased up or modified by setting up locations, safety zones, where monitoring sounds from the surroundings should be automatically enabled when entering. One example of safety zones are all intersections on a bicycle commute track. When the mobile phone detects that it enters a safety zone, it sends instructions to the associated hearing device to enable monitoring mode, thus start monitoring sound signals from the surroundings. In the same way sending disable instructions when exiting the safety zone. This functionality may also be included in sports applications that are used to track running times. The entrance or exit in or out of a predefined zone, position or area, a safety zone, may be detected through tracking of a single GPS position or through tracking of a super set of GPS positions defining an area, a geofence zone or any other predefined zone where an automatic notification is generated when entering or exit the zone.

Geofencing is a technology that defines a virtual boundary around a real-world geographical area, also known as geofence. In doing so, a radius of interest is established that can trigger an action in a geo-enabled phone or other portable electronic device. Geofencing is a mechanism provided by the OS or an application in the mobile phone that can use several position technologies, such as Wi-Fi, cellular info, GPS or BT (Bluetooth®) beacons, etc., to abstract the positioning and when a user crosses the boundary of a geofence, an alert or notification will be generated. This notification might contain information about the location of the device. The geofence notice can be sent to a mobile phone as a SMS or to an email account as an Email. A geofence could be dynamically generated, as in a radius around a store or point location, or it can be a predefined set of boundaries, like traffic cross zones, places of work, customer's sites and secure areas. Custom digitized geofences are also in use. A simple example might be an email or a text message that is automatically triggered and sent to a user's mobile phone when that user's child arrives home from school. In this example, the geofence would be a geographic virtual boundary surrounding the house. When the child's mobile phone enters this geofence, an email is automatically sent to the child's parents by a geofence-enabled app in the mobile phone.

To mark a location of interest, its latitude and longitude is specified. To adjust the proximity for the location, a radius is added. The latitude, longitude and radius then define a geofence.

FIG. 1 illustrates a system 100 for automatically enabling a monitoring mode comprising a hearing device 10, e.g. headset, and an electronic device 20, e.g. mobile phone. The system further comprising an electronic module 30 arranged for collecting environment data of the hearing device 10 and the mobile phone 20. It should be appreciated that the electronic module 30 is illustrated with a dashed border, implying in that it may be comprised in the hearing device 10, in the electronic device 20 or in both. The environment data is based on events occurring nearby the system.

In one aspect of the invention, the hearing device 10 comprises at least one sound reproducing unit 12 arranged for receiving a first audio signal and a communication means 15. The sound reproducing unit 12, e.g. a speaker is connected to the communication means 15 which receives and transfer the first sound signal to the speaker 12.

Further, the system comprises a processor 13, positioned in the electronic module 30, arranged for mixing the received first audio signal and a monitored ambient sound signal based on the collected environment data.

In one embodiment, the electronic module 30 further comprises a detecting unit 14 for collecting the environment data.

In one embodiment, the system comprises a microphone 11 which may be comprised in the hearing device 10, in the electronic device 20 or in both.

In one example, the communication means 15 is a Bluetooth module, which uses a short short-range wireless technology. However, it would also be possible to use other short-range wireless technologies. Wired communication means would also be possible.

The electronic device 20, e.g. a mobile phone comprises a microphone 21, a display 22, a keyboard 23, communication means 24, e.g. an antenna, and a speaker 25, among others.

The communication means 24 is arranged for communicating with the communication means 15 in the hearing device 10.

In one example, a hearing device 10, e.g. a headset, is wirelessly connected to an electronic device 20, e.g. a mobile phone, as shown in FIG. 1. In this exemplary case, the electronic module is positioned in the mobile phone and the electronic module collects environment data by using the detecting unit 14. The environment data comprises the information, entering data, that the user of the hearing device enters a predetermined safety zone. The collected environment data is passed on to the processor of 13 provided in the electronic module 30. The processor 13 is adapted for analysing the collected environment data, create and send a first instruction signal to the microphone 11 of the headset, by using the communication means 15, to enable monitoring mode of the microphone of hearing device. In one aspect, the microphone 21 of the mobile phone 20 may be used for monitoring the ambient sound. When the collected environment data comprises the information, exiting data, that the user of the hearing device exits the safety zone, the processor creates and sends a second instruction signal to the microphone of the headset to disable monitoring mode. In this case monitoring mode is a mode when the microphone 11 of the hearing device 10 monitors the surrounding or ambient sound signals, see FIG. 2.

In short, aspects of the disclosure provide for a hearing device 10 communicating with a mobile phone 20 and a method to implement automatically enabling and disabling of monitoring sounds from the surroundings when entering or exiting a specific location or area or when detecting certain sounds. In one embodiment geofencing is used to automatically enable and disable monitoring mode in the hearing device entering and exiting a specified geofence zone, a safety zone.

According to one exemplary embodiment, the user puts on a headset 10 connected to a mobile phone 20. The user then starts listening to music, first audio signals, through the headset 10 and starts walking along a road. The surrounding sounds are blocked out by using Digital Noise Cancellation, which uses a microphone 11 that is placed on the headset 10 and which generates sound waves that cancels the surrounding noise. When the user enters a geofence zone a message or a notification is sent to the mobile phone which instructs the headset 10 to enable full monitoring mode if the geofence zone is marked as a safety zone. A safety zone is a zone where it is important to hear the surrounding sounds, such as at a traffic crossing. When the headset 10 is put in monitoring mode the recorded sound, ambient sound signals, from the microphone 11 is mixed with the music that the user is listening to, that is, the user can hear the surroundings at the same time as the user is listening to music. The level of surroundings sounds can also be adjusted from digital noise cancelling to even enhancing surrounding sounds, by changing the settings of the mixer 13. The level of volume can be controlled by the mobile phone 20 to which the headset 10 is connected, wirelessly, such as through Bluetooth® or wired.

Figure 2:
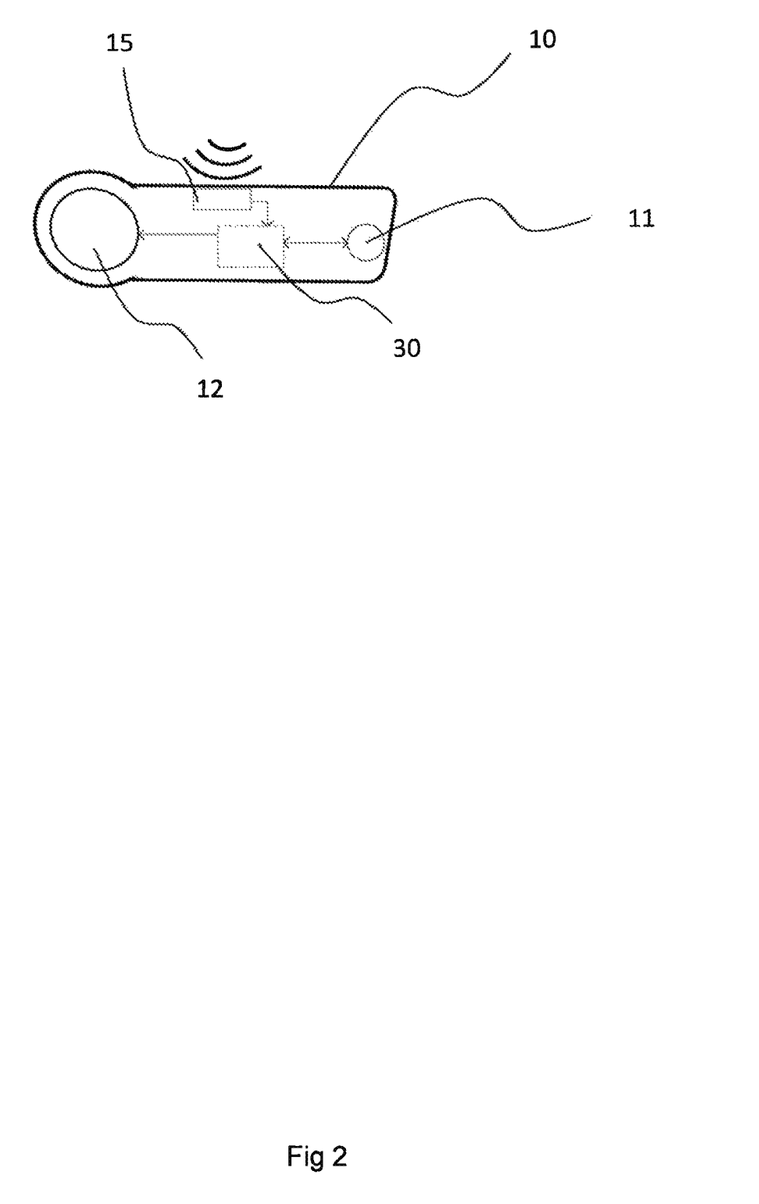
FIG. 2 illustrates a hearing device according to the present invention.
Figure 3A:
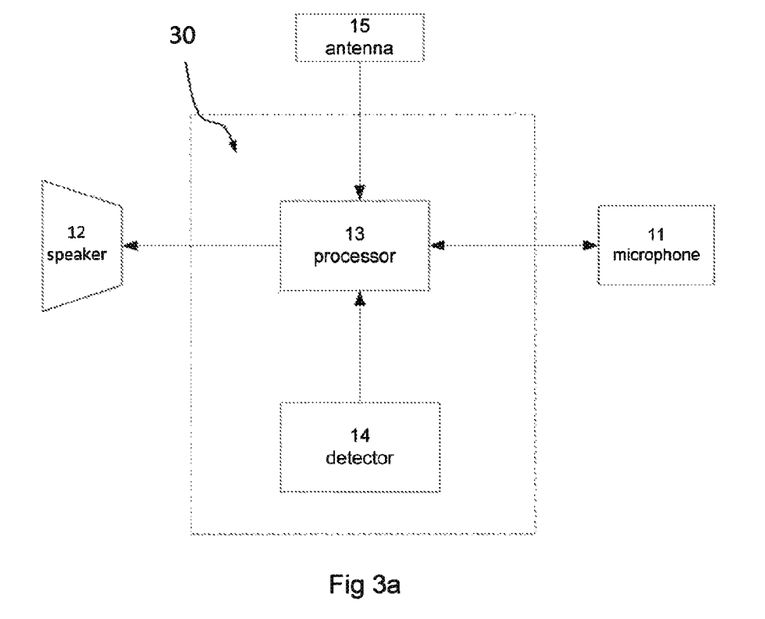
FIG. 3*a* illustrates an electronic module provided in a hearing device according to the present invention.

FIG. 2 illustrates a hearing device 10, which now will be described in further detail, comprising an electronic module 30 arranged for collecting environment data of the hearing device 10. The environment data is based on events or actions occurring nearby the hearing device. Further the hearing device comprises at least one sound reproducing unit 12, e.g. a speaker, arranged for receiving a first audio signal. The electronic module comprises a processor 13, as shown in FIG. 3a, arranged to mix said received first audio signal and a monitored ambient sound signal based on the collected environment data. The hearing device further comprises communication means 15.

Environment data may comprise location data, such as GPS coordinates for a defined location, area or zone, a geofence message or notification, such as a SMS or data sent to the mobile phone 20 that the user does not visually see, indicating entrance or exiting the defined zone or detection of predefined sound signals from specific sound sources, i.e. ambulance, traffic crossing, train crossing, car horn. The defined location, area or zone may be a traffic crossing or another area as described above. The location, area or zone may for example be pre-set by the user or downloaded from a database. In one embodiment the environment data comprises position data of the hearing device.

The first audio signal may be music or talk streamed from the associated mobile phone or another external communication device.

The ambient sound signal is sound signals monitored by a sound collecting unit 11, e.g. a microphone positioned in the hearing device 10 or in the associated mobile phone 20.

Figure 3B:
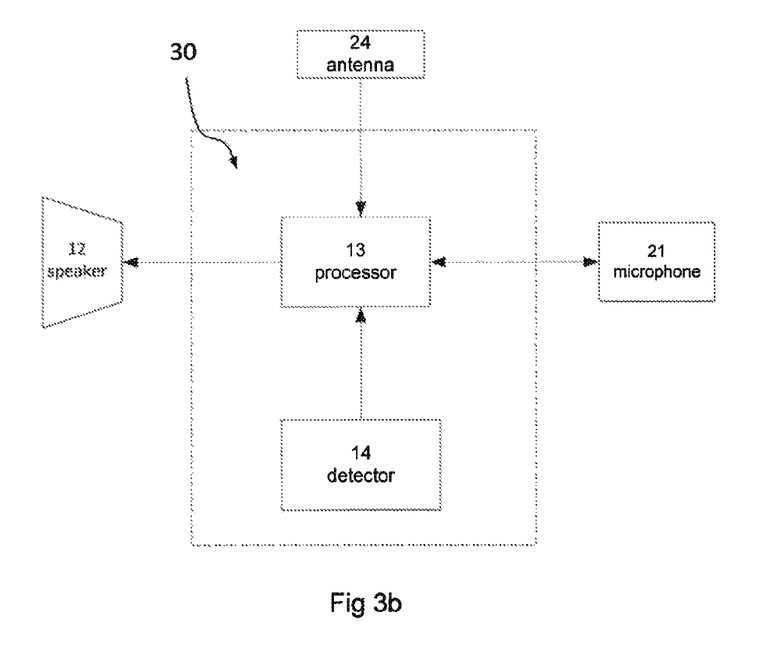
FIG. 3*b* illustrates an electronic module provided in an electronic device according to the present invention.

FIGS. 3a and 3b shows the electronic module 30 arranged to mix the received first audio signal and the monitored ambient sound signal based on the collected environment data. In one aspect, the electronic module, as shown in FIG. 3a, is provided in the hearing device and is arranged to communicate with the electronic device 20 by using a communication means 15 of the hearing device and monitoring the ambient sound signals by using the sound collecting unit 11 of the hearing device. In one aspect, the electronic module, as shown in FIG. 3b, is provided in the electronic device and is arranged to communicate with the hearing device 10 by using a communication means 24 of the electronic device and monitoring the ambient sound signals by using the sound collecting unit 21 of the electronic device. In one aspect, not shown, the electronic module 30 is provided in the electronic device 20 and arranged to monitor the ambient sound signal by using the sound collecting unit of the hearing device 10. In one aspect, not shown, the electronic module 30 is provided in the hearing device 10 and arranged to monitor the ambient sound signal by using the sound collecting unit of the electronic device 20.

In one embodiment, the electronic module 30 comprises a detector unit 14, configured to detect and collect the environment data. An event may be the event of entering a defined zone or area. An event may also be the event of a car horn honking, a person shouting or calling, an ambulance siren sounding. In one aspect the detector unit can be configured for detecting the location of the hearing device, such as the GPS coordinates of the hearing device. In one aspect the detector unit can be configured for detecting a messages or notifications indicating entrance or exit into or from a geofence zone.

In one embodiment, the processor is arranged to automatically adapt the volume of the received first audio signal in relation to the volume of the monitored ambient sound signal based on the environment data of the hearing device 10.

The hearing device may be a headset, earplugs or a hearing aid device for persons with special needs.

In other words, the hearing device is able to automatically enable the monitoring mode when detecting that the hearing devices enters a defined location, a safety zone or when detecting certain loud sounds and automatically disable the monitoring mode when exiting the safety zone or when the loud sounds are gone.

In one example, the communication means 15 is a Bluetooth module, which uses a short short-range wireless technology. However, it would also be possible to use other short-range wireless technologies. Wired communication means would also be possible.

Figure 4:
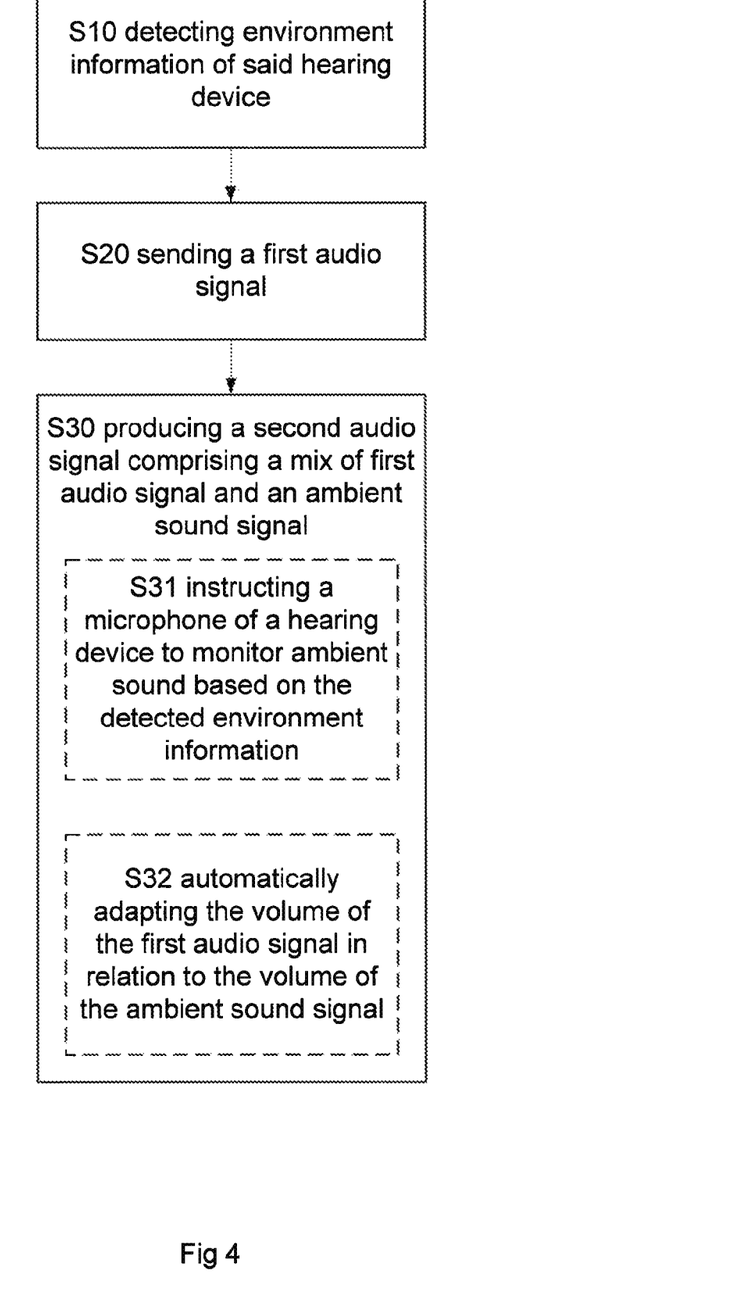
FIG. 4 illustrates a block diagram of an embodiment of the present invention.

The method will now be described starting from FIG. 4 disclosing method steps, performed in a system comprising a hearing device, e.g. a headset and a communication device, e.g. a mobile phone. When the described steps are not dependent on each other, these steps may be implemented in any combination.

In the first step S10, environment data of the hearing device is detected, wherein the environment data is based on events occurring nearby the hearing device.

In the second step S20, a first audio signal is sent to the hearing device, using a communication means 15. In one example, the communication means 15 is a Bluetooth module, which uses a short short-range wireless technology. However, it would also be possible to use other short-range wireless technologies. Wired communication means would also be possible.

In the third step S30, a second audio signal is produced in a sound reproducing unit 12 of the hearing device 10 by mixing the received first audio signal and a monitored ambient sound signal based on detected environment data of the hearing device 10.

According to some aspects, the step of the producing S30 comprises instructing S31 a microphone of the hearing device to monitor ambient sound signal based on the detected environment data.

According to one aspect, the step of producing S30 comprises automatically adapting S32 the volume of the received first audio signal in relation to the volume of the monitored ambient sound signal based on the environment data of the hearing device. Thus, the sound levels on the ambient sound signal is dependent on for example if the user is nearby or in a zone that is an identified safety zone e.g. a dangerous traffic cross, if an ambulance is close or if there has been an accident.

According to one aspect the step of producing S30 further comprises the steps of:
  if a criteria defined in said hearing device 10 is fulfilled then generating a second audio signal by mixing both the received first audio signal and the monitored ambient sound signal; and
  if said criteria is not fulfilled then generating a second audio signal based on only the received first audio signal.

The criteria is fulfilled when the environment data matches predetermined environment data. This may be predetermined by the user of the hearing device or in factory. One exemplary embodiment is when the user enters a geofence zone and receives a notification that matches a predetermined geofence zone then the monitoring mode is enabled in the hearing device, thus the microphone of the hearing device monitors the ambient or surrounding sound and the processor of the hearing device produces a second sound signal by mixing the first sound signal with the monitored ambient sound. If the notification does not match a predetermined geofence zone, the criteria is not fulfilled and the processor of the hearing device produces a second sound signal with only the first sound signal, thus there will be no difference for the user.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that variations may be made in those embodiments by those skilled in the art without departing from the scope of the present invention as defined by the following claims.

The invention claimed is:

1. A hearing device configured for automatically enabling a monitoring mode of said hearing device comprising:
  an electronic module configured to collect environment data in a vicinity of said hearing device; and
  at least one sound reproducing unit configured to receive at least a first audio signal and a second audio signal;
  wherein said electronic module comprises a processor configured to:
    send said first audio signal to said sound reproducing unit;
    evaluate said collected environment data to determine that said collected environment data matches predetermined environment data;
    automatically enable said monitoring mode of said hearing device when said collected environment data matches said predetermined environment data, wherein said monitoring mode operates to:
      monitor ambient sound in said vicinity of said hearing device;
      produce said second audio signal by mixing said first audio signal and said monitored ambient sound; and
      send said second audio signal, in place of said first audio signal, to said sound reproducing unit.

2. The hearing device according to claim 1, wherein the processor is configured to automatically adapt the volume of said monitored ambient sound in said second audio signal in relation to the volume of said monitored ambient sound.

3. The hearing device according to claim 1, wherein said electronic module further comprises a detecting unit configured to detect and collect said environment data.

4. The hearing device according to claim 1, wherein said environment data comprises GPS coordinates of the hearing device.

5. The hearing device according to claim 1, wherein said environment data comprises a notification of entrance into a predefined zone.

6. The hearing device according to claim 1, wherein said environment data comprises a notification of exit out of a predefined zone.

7. The hearing device according to claim 1, wherein said hearing device further comprises a microphone arranged for monitoring the ambient sound signal.

8. The hearing device according to claim 1, wherein the processor is further configured to disable said monitoring mode and send said first audio signal to said sound producing unit in place of said second audio signal, when said collected environment data no longer matches said predetermined environment data.

9. A system for automatically enabling a monitoring mode based on events in a vicinity of said system comprising a hearing device and an electronic device, wherein said system comprises:
  an electronic module configured to collect environment data in said vicinity of said system;
  at least one sound reproducing unit positioned in said hearing device and configured to receive at least a first audio signal and a second audio signal; and
  a processor positioned in said electronic module configured to:
    send said first audio signal to said sound reproducing unit;

evaluate said collected environment data to determine that said collected environment data matches predetermined environment data;

automatically enable said monitoring mode of said hearing device when said collected environment data matches said predetermined environment data, wherein said monitoring mode operates to:

monitor ambient sound in said vicinity of said hearing device;

produce said second audio signal by mixing said first audio signal and said monitored ambient sound; and send said second audio signal, in place of said first audio signal, to said sound reproducing unit.

10. The system according to claim 9, wherein said electronic module is positioned in said hearing device.

11. The system according to claim 9, wherein said electronic module is positioned in said electronic device.

12. The system according to claim 9, wherein said hearing device and said electronic device are communicating wirelessly.

13. The system according to claim 12, wherein said hearing device and said electronic device are communicating by using Bluetooth.

14. The system according to claim 9, wherein said processor is further configured to disable said monitoring mode and send said first audio signal to said sound producing unit in place of said second audio signal, when said collected environment data no longer matches said predetermined environment data.

15. A method for automatically enabling a monitoring mode in a hearing device, wherein the method comprises:

sending a first audio signal to said hearing device;

collecting environment data in a vicinity of said hearing device;

evaluating said collected environment data to determine that said collected environment data matches predetermined environment data;

enabling said monitoring mode of said hearing device when said collected environment data matches said predetermined environment data, wherein said monitoring mode carries out the steps of:

monitoring ambient sound in said vicinity of said hearing device;

producing a second audio signal in a sound reproducing unit of said hearing device by mixing said first audio signal and said monitored ambient sound;

sending said second audio signal to said hearing device in place of said first audio signal.

16. The method according to claim 15, wherein the step of producing comprises instructing a microphone of said hearing device to monitor ambient sound signal based on the detected environment data.

17. The method according to claim 15, wherein the step of producing comprises automatically adapting the volume of said monitored ambient sound in said second audio signal in relation to the volume of said monitored ambient sound.

18. The method according to claim 15, further comprising:

disabling said monitoring mode when said collected environment data no longer matches said predetermined environment data; and sending said first audio signal to said hearing device in place of said second audio signal.

* * * * *